United States Patent [19]
Huang

[11] Patent Number: 5,851,878
[45] Date of Patent: Dec. 22, 1998

[54] METHOD OF FORMING A RUGGED POLYSILICON FIN STRUCTURE IN DRAM

[75] Inventor: Hsiu-Wen Huang, Kaohsiung, Taiwan

[73] Assignee: United Microelectronics Corporation, Taiwan

[21] Appl. No.: 888,560

[22] Filed: Jul. 7, 1997

Related U.S. Application Data

[60] Provisional application No. 60/042,527 Apr. 1, 1997.
[51] Int. Cl.[6] .................................................. H01L 21/8242
[52] U.S. Cl. .......................................... 438/255; 438/398
[58] Field of Search .................................... 438/253, 254, 438/255, 396, 397, 398; 148/DIG. 14

[56] References Cited

U.S. PATENT DOCUMENTS 5,049,517  9/1991  Liu et al. .................................. 438/397
5,491,103  2/1996  Ahn .......................................... 438/397

*Primary Examiner*—Tuan H. Nguyen
*Attorney, Agent, or Firm*—Rabin & Champagne P.C.

[57] ABSTRACT

The capacitor for a DRAM is formed to have a textured bottom electrode using wet etch processes. A planarized dielectric layer is formed over the transfer FETs and bit line of a capacitor over bit line DRAM cell. A layer of silicon nitride is deposited over the planarized dielectric layer. A layer of silicon oxide is deposited over the silicon nitride layer and then a contact via is etched to expose the charge storage node of a transfer FET of the DRAM cell. A layer of polysilicon is deposited over the silicon oxide layer and into the contact via to connect the polysilicon layer to the charge storage node of the transfer FET. The polysilicon layer is patterned to define bottom capacitor plates. The silicon oxide layer is etched using hydrofluoric acid to expose the bottom surface of the polysilicon bottom capacitor plate. Next, a hydrofluoric acid dip is used to create a rugged polysilicon surface on the upper and lower surfaces of the bottom capacitor electrodes. A capacitor dielectric is provided and an upper capacitor electrode is formed to complete the DRAM cell.

14 Claims, 4 Drawing Sheets

METHOD OF FORMING A RUGGED POLYSILICON FIN STRUCTURE IN DRAM

This application claims priority from provisional application Ser. No. 60/042,527, filed Apr. 1, 1997.

BACKGROUND OF THE INVENTION

1. Field of the Invention

The present invention relates to the formation of capacitors for integrated circuit memories and particularly to methods of forming high capacitance structures in a high production manufacturing environment.

2. Description of the Related Art

In dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one. The surface area of the electrodes of the memory capacitors determines the amount of charge that can be stored on each of the capacitors for a given operating voltage, for the electrode separation that can reliably be manufactured, and for the dielectric constant of the capacitor dielectric typically used between the electrodes of the charge storage capacitor. Read and write operations are performed in the memory by selectively coupling the charge storage capacitor to a bit line to either transfer charge to or from the charge storage capacitor. The selective coupling of the charge storage capacitor to the bit line is typically accomplished using a transfer field effect transistor (FET). The bit line contact is typically made to one of the source/drain electrodes of the transfer FET and the charge storage capacitor is typically formed in contact with the other of the source/drain electrodes of the transfer FET. Word line signals are supplied to the gate of the FET to connect one electrode of the charge storage capacitor through the transfer FET to the bit line contact facilitating the transfer of charge between the charge storage capacitor and the bit line.

There is a continuing trend toward increasing the storage density of integrated circuit memories to provide increased levels of data storage on a single chip. Higher density memories provide storage that is generally more compact and is often cheaper on a per bit basis than an equivalent amount of storage provided on plural chips. It has generally been possible to provide these higher levels of storage at equivalent or improved levels of performance as compared to the earlier, less dense memory chips. Historically, the density of integrated circuit devices has been increased in part by decreasing the size of structures such as wiring lines and transistor gates as well as by decreasing the separation between the structures that make up the integrated circuit device. Reducing the size of circuit structures is generally referred to as decreasing the "design rules" used for the manufacture of the integrated circuit device.

Applying reduced design rules to a DRAM reduce the substrate surface area that can be devoted to the charge storage capacitor of the DRAM. Thus, applying reduced design rules to conventional planar capacitor designs reduces the amount of charge (i.e., capacitance) that can be stored on the charge storage capacitor. Reducing the amount of charge on the capacitor leads to a variety of problems, including the potential loss of data due to greater susceptibility to decay mechanisms and to charge leakage. This greater susceptibility to charge loss may cause the DRAM to require more frequent refresh cycles, which is undesirable since the memory may be unavailable for data storage and readout transactions during refresh activities. In addition, reduced levels of charge storage might require more sophisticated data readout schemes or more sensitive differential amplifiers. Thus, modern DRAMs require high levels of capacitance in reduced substrate area DRAM cells. To this end, a variety of very complex capacitor structures having three dimensional charge storage surfaces have been proposed. In general, these complex capacitor structures are difficult to manufacture. This is particularly true when the requirements for forming such capacitor structures in a high throughput manufacturing environment in a manner compatible with high yields are taken into account. It is accordingly an object of the present invention to provide a capacitor structure that is more compatible with a high volume manufacturing environment.

SUMMARY OF THE PREFERRED EMBODIMENTS

According to one aspect, the present invention forms an integrated circuit memory device including charge storage capacitors on a substrate having charge storage capacitor access circuitry formed thereon. A first layer of dielectric material is provided over the substrate and over the access circuitry, a barrier layer is provided over the first layer of dielectric material, and a sacrificial layer is provided over the barrier layer. A first polysilicon layer is provided over the sacrificial layer and patterned to define a plurality of bottom capacitor electrodes separated by spaces. A first wet etchant etches the sacrificial layer through the spaces between the bottom capacitor electrodes, removing the sacrificial layer from between the barrier layer and the first polysilicon layer. A capacitor dielectric layer is provided over the bottom electrodes and a second polysilicon layer is provided over the capacitor dielectric layer to form an upper capacitor electrode.

According to another aspect, the present invention forms an integrated circuit memory device including charge storage capacitors on a substrate having charge storage capacitor access circuitry formed thereon. A first layer of dielectric material is provided over the substrate and over the access circuitry, a barrier layer is provided on the first layer of dielectric material, and a sacrificial layer is provided on the barrier layer. A first polysilicon layer is provided on the sacrificial layer and patterned to define a plurality of bottom capacitor electrodes separated by spaces. A first wet etchant etches the sacrificial layer through the spaces between the bottom capacitor electrodes, removing the sacrificial layer from between the barrier layer and the first polysilicon layer. Upper and lower surfaces of the bottom capacitor electrodes are exposed to a second wet etchant to form a textured polysilicon surface on the upper and lower surfaces of the bottom capacitor electrodes, wherein the bottom capacitor electrodes are doped prior to forming the textured polysilicon surfaces. A capacitor dielectric layer is provided over the bottom electrodes and a second polysilicon layer is provided over the capacitor dielectric layer to form an upper capacitor electrode.

DETAILED DESCRIPTION OF THE PREFERRED EMBODIMENTS

Preferred embodiments of the present invention provide a high capacitance DRAM capacitor using methods compatible with high volume manufacture. Methods described herein find particular applicability to the formation of a DRAM capacitor for use in a capacitor over bit line (COB) DRAM cell. Briefly, a conventional capacitor over bit line process is used to form transfer FETs on the active device regions of the silicon substrate. A bit line structure is formed in contact with the common source/drain regions of FET pairs and then a layer of dielectric is deposited over the cell structure and planarized. A silicon nitride barrier layer is provided over the planarized dielectric, then a silicon oxide layer is deposited over the silicon nitride barrier layer. Next, a contact hole is opened through the silicon oxide, silicon nitride barrier layer, and the planarized dielectric layer. A polysilicon layer is deposited within the contact hole and over the surface of the silicon oxide layer. The polysilicon layer is patterned to define the extent of a capacitor bottom electrode and then a wet etching process is performed to remove the silicon oxide from beneath the capacitor electrode. This wet etching process stops on the silicon nitride barrier layer and provides a bottom capacitor electrode having exposed upper and lower surfaces in a simply manufactured manner.

In a particularly preferred embodiment of the present invention, a further processing step is performed to texture the upper and lower surfaces of the bottom capacitor electrode. This is preferably accomplished using a hot phosphoric acid dip for sufficient time to create a rugged polysilicon surface on the capacitor electrode. This preferred texturing process also serves to remove the silicon nitride barrier layer but stops on the planarized dielectric layer. Further processing forms a capacitor dielectric layer and an upper capacitor electrode. The DRAM capacitor formed in this manner provides increased capacitance in a readily manufactured manner. Further discussion of these aspects and further preferred aspects of the present invention is now presented with specific reference to FIGS. 1–10.

Figure 1:
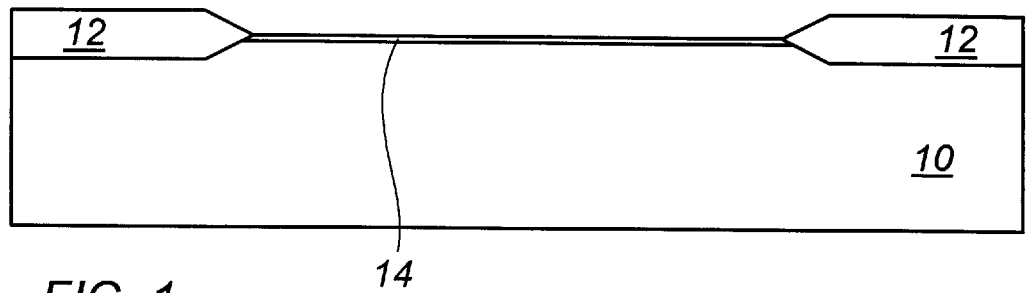
FIGS. 1–10 illustrate steps in the manufacture of a DRAM cell in accordance with preferred aspects of the present invention.
Figure 2:
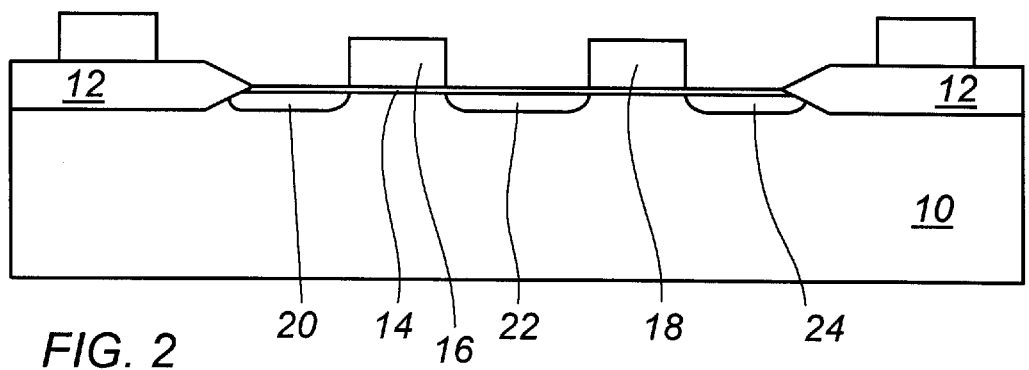
Figure 3:
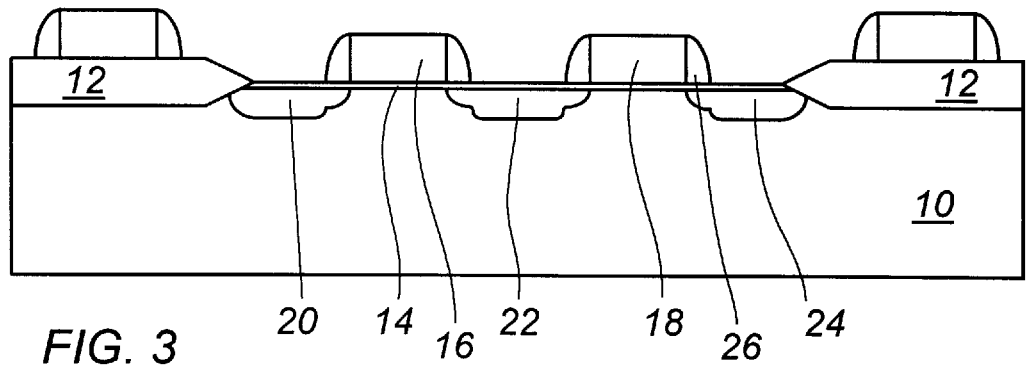
Figure 4:
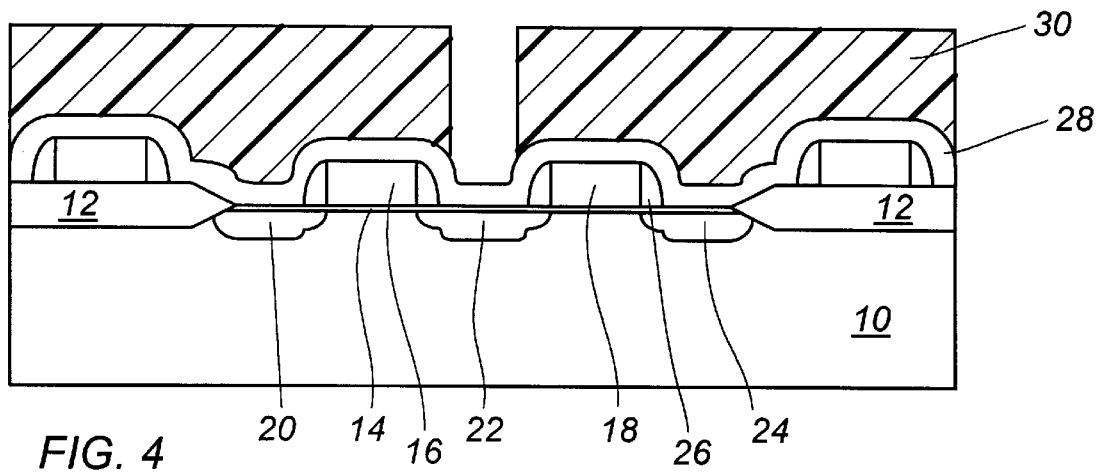
Figure 5:
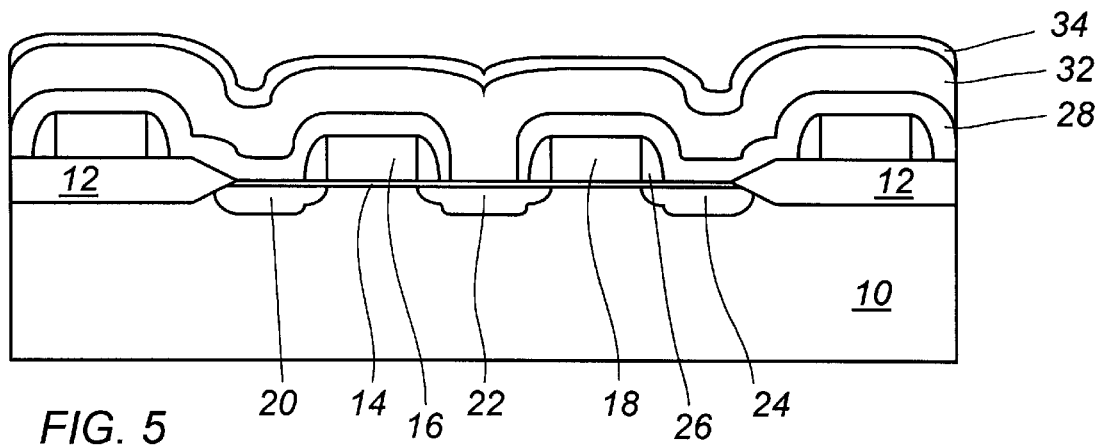

Formation of a dynamic random access memory (DRAM) in accordance with preferred embodiments of the present invention begins on a P-type substrate 10. FIG. 1 illustrates a silicon substrate 10 having device isolation structures 12 formed on its surface and with a gate oxide layer 14 covering the active device region of the substrate. The device illustrated in FIG. 1 incorporates field oxide regions formed by the local oxidation of silicon (LOCOS) technique. Other types of device isolation regions might alternately be provided including, for example, shallow trench isolation regions filled with CVD oxide. Transfer FETs are formed on the active device region in the conventional fashion. Referring to FIG. 2, a polysilicon layer is deposited over the FIG. 1 structure and patterned to define polysilicon gate electrodes 16, 18. The polysilicon may be doped either in situ during deposition or by ion implantation of the blanket deposited polysilicon layer before patterning or by ion implantation of the patterned gate electrodes 16, 18 at some point in the processing. A first implantation is then made into the source/drain regions 20, 22 and 24 of the two illustrated FETs. In some embodiments, it may be preferred to provide a lightly doped drain (LDD) structure for each of the source/drain regions illustrated in FIG. 2. In other instances, it may be desirable to only provide an LDD structure for the source/drain region 22 that is common to the two FETs in the illustrated active device region. To form an LDD structure for each of the illustrated source/drain regions, a layer of silicon oxide is blanket deposited over the FIG. 2 structure and then etched back to form insulating spacer structures 26 on each side of the gate electrodes 16, 18. A second implantation of N-type dopants is then made into the substrate 10 self-aligned to the spacer structures 26 forming the more heavily doped portions of the LDD source/drain regions. The resulting structure is illustrated in FIG. 3. Next, a layer of dielectric material such as CVD silicon oxide is provided over the surface of the FIG. 3 device. This interpolysilicon dielectric layer might have a thickness of approximately 500–1000 Å. A mask 30 is then formed over the interpolysilicon dielectric layer 28 and patterned to provide an opening over the common source/drain region 22, as shown in FIG. 4. The mask may be formed by conventional photolithography using photoresist as the mask material. An opening is formed through the interpolysilicon dielectric layer 28, typically by an oxide etch using an etchant derived from a plasma including fluorine species. This etch process typically proceeds through the gate oxide layer 14 over source/drain region 22, if any gate oxide remains after the spacer etch. The mask 30 is then stripped by, for example, ashing and a layer of polysilicon is blanket deposited to form the partially-completed device illustrated in FIG. 5.

Figure 6:
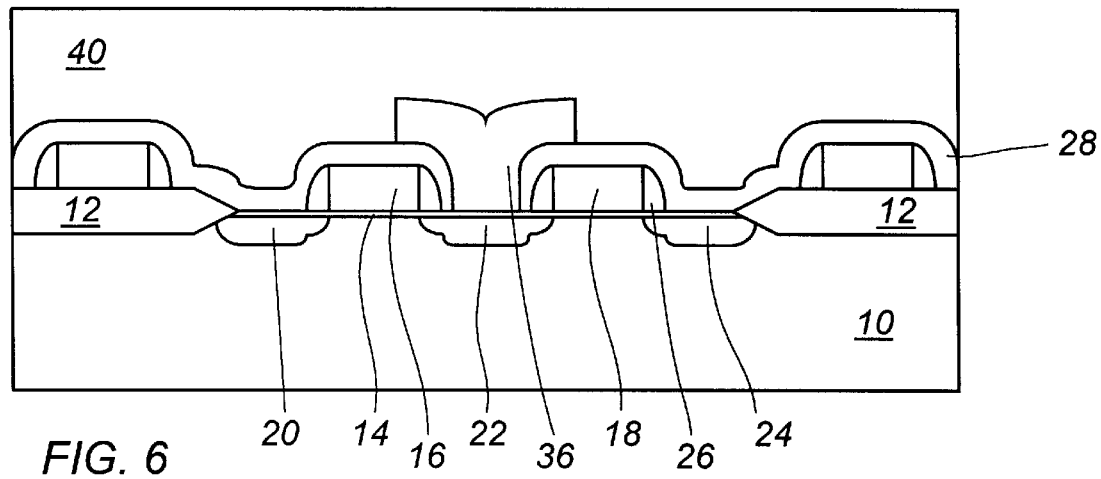

Because the blanket polysilicon layer 32 will be formed into the bit line for the illustrated DRAM cell, it is preferred that the polysilicon layer be highly doped. In addition, it is typically preferred to provide a second, more conductive layer on the blanket polysilicon layer 32. A layer of metal silicide 34, preferably a silicide of a refractory metal such as titanium silicide or tungsten silicide is provided by CVD over the polysilicon layer 32. The resulting two layer "polycide" is then patterned to form the bit line structure 36, as illustrated in FIG. 6. As is also illustrated in FIG. 6, processing continues to form a planarized dielectric layer 40 over the transfer FETs and bit line structures 36. The planarized dielectric may be formed, for example, by plasma enhanced chemical vapor deposition (PECVD) of approximately 3000 Å of boron phosphorus silicate glass (BPSG). Deposition of the BPSG layer will have a planarizing effect on the device, but will generally not provide as much planarization as is desired. Accordingly, further planarization is provided using, for example, a process in which a sacrificial layer is deposited over the surface of the BPSG layer followed by an etchback step. More preferably though, the BPSG layer is planarized by chemical mechanical polishing (CMP) to form the planarized dielectric layer 40 shown in FIG. 6.

A series of layers are now formed over the planarized dielectric layer 40 that are used in the formation of a bottom capacitor electrode that provides upper and lower charge storage surfaces. The different materials deposited over the planarized dielectric layer are primarily selected for their compatibility with the preferred wet etching processes used both in selectively removing at least one of these layers and in forming the preferred textured surface of the DRAM capacitor electrode. To this end, it is preferred that the planarized dielectric layer 40 be formed of a material that does not readily etch in a first wet etchant such as phosphoric acid. Alternately, the planarized dielectric layer 40 might be covered by a thin layer of a material such as silicon oxide that does not readily etch in phosphoric acid. A first layer deposited over the planarized dielectric layer 40 is chosen as a stop against a second wet etchant such as hydrofluoric acid. This first layer may be silicon nitride or a similar material. The second layer of material deposited over the first layer of material is preferably chosen to have a relatively high deposition rate and to be readily etched in a second etchant solution that may include hydrofluoric acid. Of course, if different acid etches or other wet etches are chosen for selectively removing the second layer and for texturizing the capacitor, then other materials having appropriate characteristics would be preferred. For the preferred embodiments described herein, however, the planarized dielectric layer is preferably a glass or another oxide dielectric. The first layer deposited onto the surface of the planarized dielectric layer 40 is silicon nitride and the second layer deposited onto the surface of the silicon nitride layer is preferably silicon oxide.

Figure 7:
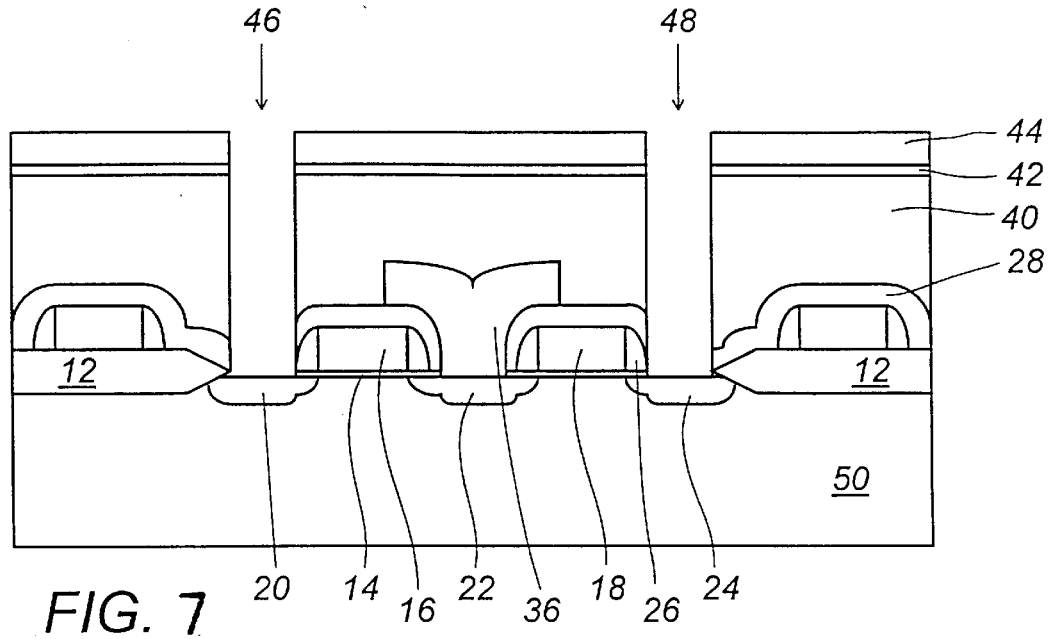

Thus, as shown in FIG. 7, a layer of silicon nitride 42 is deposited to a thickness of approximately 300 Å by CVD onto the surface of the planarized dielectric layer 40. The thickness of the silicon nitride layer 42 is selected to provide sufficient process margin to safely protect the planarized dielectric layer 40 from the hydrofluoric acid etch process. An approximately 1000 Å thick silicon oxide layer 44 is then provided by CVD to form the second layer on the surface of the silicon nitride layer 42. The thickness of the oxide layer 44 is chosen to set the height of the lower edge of the bottom capacitor electrode. Accordingly, the thickness of the oxide layer 44 is chosen to provide sufficient separation between the lower surface of the capacitor electrode and the surface of the planarized dielectric layer 40 to allow for formation of the upper capacitor electrode and for the other processing necessary to complete the DRAM capacitor. Next, a photoresist mask is provided over the silicon oxide layer 44 which provides openings exposing the oxide layer 44 above source/drain regions 20 and 24. Contact vias 46 and 48 are then etched through the dielectric layers 44, 42, 40 and 28 in sequence. As all of these materials are oxides and nitrides of silicon, it is possible to perform the via etch in a continuous process using either a single etchant system or different etchant systems optimized for the particular materials being etched. All dielectric layers may be etched in a commercially available dielectric etcher such as the Lam Research Rainbow etcher using an etchant system derived from a fluorine bearing species in a plasma environment.

Figure 8:
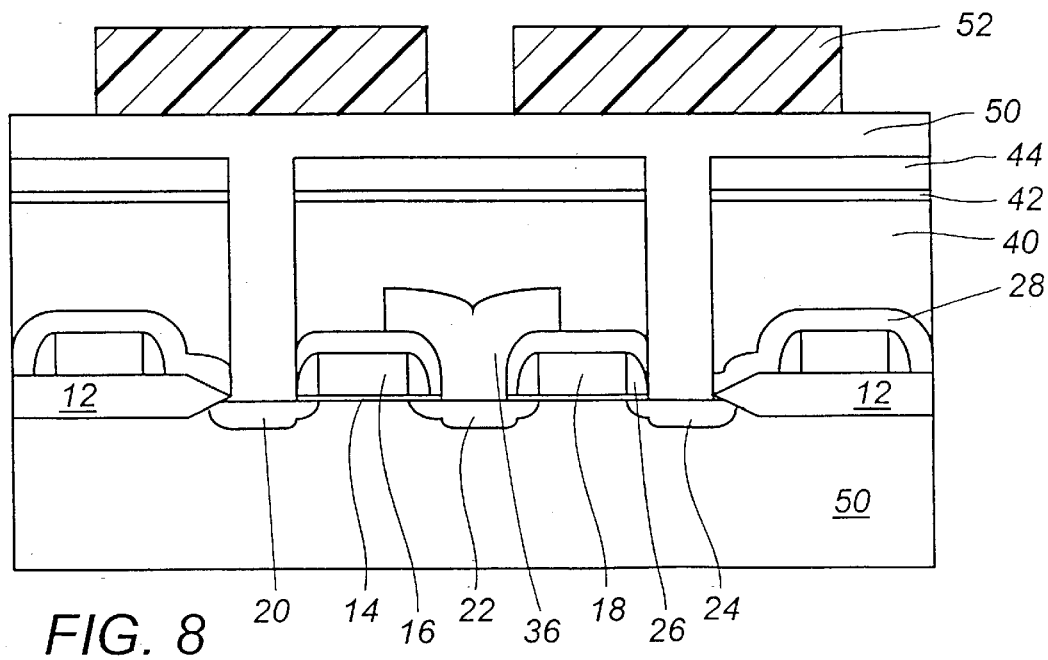

After the contact vias 46 and 48 have been opened and cleared to expose clean surfaces of the source/drain regions 20 and 24, a layer of polysilicon 50 is deposited by low pressure chemical vapor deposition (LPCVD) into the contact vias and over the oxide layer 44. The polysilicon layer 50 will be patterned into the bottom electrode of the DRAM capacitor and will be subjected to an etching process to provide a textured surface. As such, it is necessary to provide a sufficient thickness for the polysilicon layer 50 to allow both for the removal of material during the texturing process and to form a mechanically sound structure that will not likely be damaged during the subsequent processing steps in which the bottom capacitor electrode will not be supported. As such, it is preferred that the polysilicon layer 50 be deposited to a thickness of approximately 1000 Å or more. The polysilicon layer 50 may be doped by ion implantation and annealing or by in situ doping during deposition. In situ doping is preferred to ensure that a uniform and high level of doping is present throughout the entire depth of the vertical polysilicon line within the vias 46 and 48, which may be as much as 6000–7000 Å in height. Depending upon the particular processing used for forming the polysilicon layer 50, it may be desirable to deposit a thicker layer of polysilicon and then to provide a more planar surface on layer 50 by chemical mechanical polishing or etchback. A photoresist mask 52 is then provided on the surface of the polysilicon layer 50 to define the lateral extent of the bottom electrodes (FIG. 8). Most preferably, the photoresist mask 52 defines a separation between adjacent bottom electrodes that is sufficient to allow for easy further processing of the device.

Figure 9:
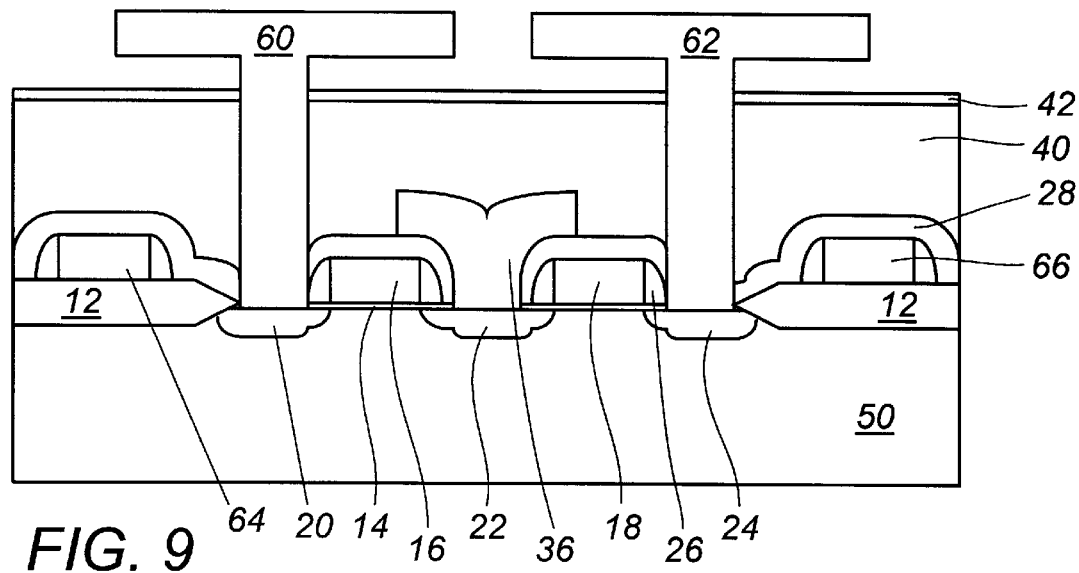

Polysilicon layer 50 is then etched anisotropically where exposed by the openings in photoresist mask 52 using, for example, a plasma etchant derived from HCl and HBr source gases. The photoresist mask 52 is then removed by ashing. Next, the device is subjected to a dip etch in a dilute or buffered hydrofluoric acid solution. Such a solution will tend to not attack the polysilicon bottom electrodes and will readily etch the oxide layer 48, stopping on the silicon nitride layer 42. The end result of this process is shown in FIG. 9. Bottom capacitor electrode plates 60 and 62 are respectively connected to source/drain regions 20 and 22 through polysilicon interconnects extending through vias 46 and 48 respectively. Each of the bottom electrode plates 60 and 62 is spaced away from the silicon nitride layer 42 which covers the planarized dielectric layer 40. The plates 60 and 62 each extend toward the bit line 36 and extend outwardly toward the wiring lines 64 and 66 respectively.

Figure 10:
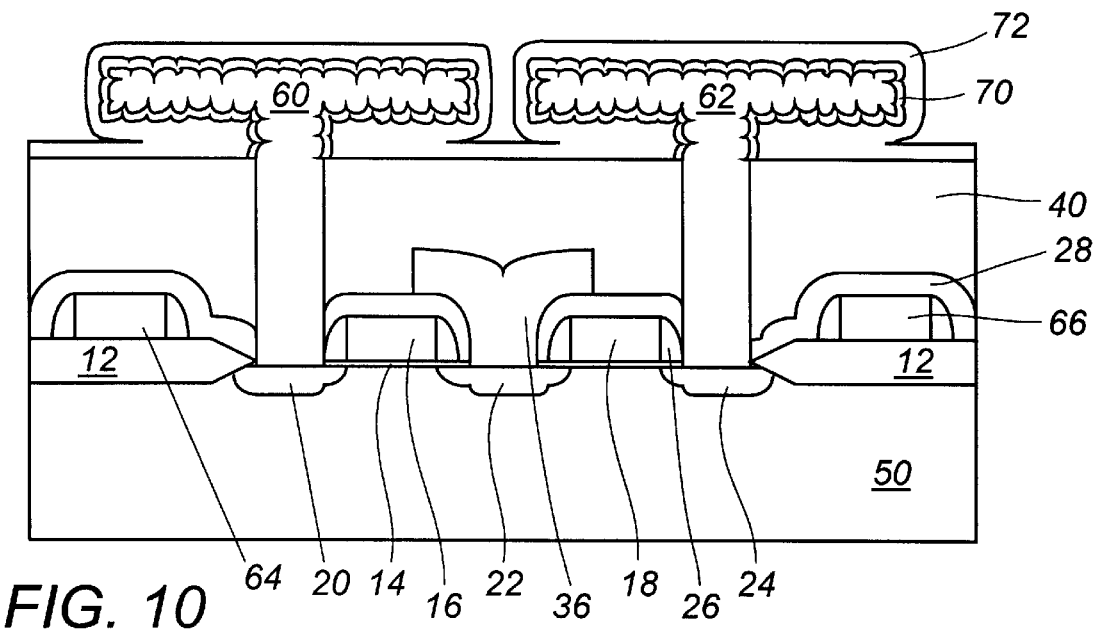

The FIG. 9 structure is preferably then subjected to a dip in a phosphoric acid bath heated to a temperature of about 100°–150° C. This phosphoric acid etch will proceed preferentially along polysilicon grain boundaries producing a rugged polysilicon surface after an etch of approximately one or two hours, if the polysilicon bottom electrode 60, 62 is doped with phosphorus. The surface roughness produced in this manner is on the order of about 100 nanometers (peak to valley) or more. The resulting rugged polysilicon surface is similar in many respects to that produced by other methods of forming a rugged polysilicon or hemispherical-grained polysilicon surface. The phosphoric acid dip of the present invention is however preferred as more simply providing a rugged polysilicon surface which has desirable surface properties and which is doped to an appropriate level without further processing. This is in contrast to hemispherical-grained polysilicon, which may be difficult to dope and which may have unacceptable surface properties that preclude the formation of reliable capacitor dielectrics. The phosphoric acid dip used to form the textured surface on the polysilicon plates 60 and 62 also serves to remove the silicon nitride barrier 42 from the surface of the planarized dielectric layer 40. The resulting structure is shown in FIG. 10.

A capacitor dielectric layer 70 is then provided over the rugged polysilicon surface of plate 60 and plate 62. Various capacitor dielectrics are known and include, for example, the multilayer oxide/nitride/oxide dielectric typically referred to as "ONO." Such a structure may be formed by allowing a native oxide layer to grow over the rugged polysilicon surface, depositing a thin layer of silicon nitride by chemical vapor deposition and then oxidizing a thin portion of the nitride surface in a thermal oxidation process to complete the ONO capacitor dielectric 70. Next, an upper capacitor plate 72 is formed over the bottom capacitor electrodes by blanket LPCVD of polysilicon, preferably doped in situ during deposition or less preferably by ion implantation doping and annealing. The upper capacitor electrode is patterned and further processing is performed to complete the DRAM device.

While the present invention has been described in terms of certain preferred embodiments thereof, those of ordinary skill in the art will appreciate that various modifications might be made to the embodiments described herein without altering the fundamental teachings of the present invention. As such, the present invention is not to be limited to the particular specific embodiments described. Rather the scope of the present invention is to be determined from the claims which follow.

What is claimed:

1. A method of forming an integrated circuit memory device including charge storage capacitors, the method comprising:
   providing a substrate having charge storage capacitor access circuitry formed thereon;
   providing a first layer of dielectric material over the substrate and over and on the access circuitry;
   providing a second dielectric layer over the first layer of dielectric material;
   providing a barrier layer over the second dielectric layer;
   providing a sacrificial layer over the barrier layer;
   providing a first polysilicon layer over the sacrificial layer and patterning the layer of polysilicon to define a plurality of bottom capacitor electrodes separated by spaces;
   providing a first wet etchant to the sacrificial layer through the spaces between the bottom capacitor electrodes, removing the sacrificial layer from between the barrier layer and the first polysilicon layer;
   providing a capacitor dielectric layer over the bottom capacitor electrodes; and
   providing a second polysilicon layer over the capacitor dielectric layer to form an upper capacitor electrode.

2. The method of claim 1, further comprising the step of exposing upper and lower surfaces of the bottom capacitor electrodes to a second wet etchant to form a textured polysilicon surface on the upper and lower surfaces of the bottom capacitor electrodes.

3. The method of claim 2, wherein the second wet etchant removes the barrier layer and exposes a surface of the second dielectric layer as the textured polysilicon surface is formed.

4. The method of claim 3, wherein the barrier layer and the sacrificial layers are third and fourth dielectric layers, respectively.

5. The method of claim 4, wherein the barrier layer is silicon nitride and the second etchant comprises phosphoric acid.

6. The method of claim 2, wherein the barrier layer is silicon nitride and the first etchant comprises HF in solution.

7. The method of claim 2, wherein the charge storage capacitor access circuitry comprises a transfer FET associated with each charge storage capacitor and wherein a polysilicon column connects a source/drain region of the transfer FET to the bottom electrode of the associated charge storage capacitor.

8. The method of claim 7, wherein the bottom electrode of the charge storage capacitor has a roughness of at least about 100 nanometers.

9. The method of claim 7, further comprising planarizing the surface of the second dielectric layer, wherein the second polysilicon layer lies above the bottom capacitor electrode and between the bottom capacitor electrode and the second dielectric layer.

10. The method of claim 1, wherein the first layer of dielectric material, the second dielectric layer, the barrier layer, and the sacrificial layer each are comprised of one of oxides and nitrides of silicon; further comprising forming a contact via through the first layer of dielectric material, the second dielectric layer, the barrier layer, and the sacrificial layer in a continuous process using a single etchant system.

11. A method of forming an integrated circuit memory device including charge storage capacitors, the method comprising:
    providing a substrate having charge storage capacitor access circuitry formed thereon,
    providing a first layer of dielectric material over the substrate and over and on the access circuitry;
    providing a second dielectric layer over the first layer of dielectric material;
    providing a barrier layer on the second dielectric layer;
    providing a sacrificial layer on the barrier layer;
    providing a first polysilicon layer on the sacrificial layer and patterning the layer of polysilicon to define a plurality of bottom capacitor electrodes separated by spaces;
    providing a first wet etchant to the sacrificial layer through the spaces between the bottom capacitor electrodes, removing the sacrificial layer from between the barrier layer and the first polysilicon layer;
    exposing upper and lower surfaces of the bottom capacitor electrodes to a second wet etchant to form a textured polysilicon surface on the upper and lower surfaces of the bottom capacitor electrodes, wherein the bottom capacitor electrodes are doped prior to forming the textured polysilicon surfaces;
    providing a capacitor dielectric layer over the bottom capacitor electrodes; and
    providing a second polysilicon layer over the capacitor dielectric layer to form an upper capacitor electrode.

12. The method of claim 11, wherein the sacrificial layer comprises silicon oxide and wherein the barrier layer comprises silicon and nitrogen.

13. The method of claim 12, wherein the first etchant includes hydrofluoric acid in solution and wherein the second etchant includes phosphoric acid in solution.

14. The method of claim 10, wherein the first layer of dielectric material, the second dielectric layer, the barrier layer, and the sacrificial layer each are comprised of one of oxides and nitrides of silicon; further comprising forming a contact via through the first layer of dielectric material, the second dielectric layer, the barrier layer, and the sacrificial layer in a continuous process using a single etchant system.

* * * * *